United States Patent
Ohashi et al.

(10) Patent No.: US 9,450,174 B2
(45) Date of Patent: *Sep. 20, 2016

(54) PIEZOELECTRIC ELEMENT

(71) Applicant: AJINOMOTO CO., INC., Tokyo (JP)

(72) Inventors: Satoru Ohashi, Kawasaki (JP); Sei Uemura, Tsukuba (JP); Manabu Kitazawa, Kawasaki (JP); Toshihide Kamata, Tsukuba (JP); Yoshinori Wada, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 100 days.

This patent is subject to a terminal disclaimer.

(21) Appl. No.: 14/458,632

(22) Filed: Aug. 13, 2014

(65) Prior Publication Data

US 2014/0368083 A1    Dec. 18, 2014

Related U.S. Application Data

(63) Continuation of application No. PCT/JP2013/054240, filed on Feb. 13, 2013.

(30) Foreign Application Priority Data

Feb. 14, 2012  (JP) ................. 2012-029031

(51) Int. Cl.
- *H01L 41/08*    (2006.01)
- *H01L 41/193*   (2006.01)
- *H01L 41/45*    (2013.01)
- *C08G 69/10*    (2006.01)
- *C08L 77/04*    (2006.01)
- *H01L 41/29*    (2013.01)

(52) U.S. Cl.
CPC ............ *H01L 41/193* (2013.01); *C08G 69/10* (2013.01); *C08L 77/04* (2013.01); *H01L 41/29* (2013.01); *H01L 41/45* (2013.01); *Y10T 29/42* (2015.01)

(58) Field of Classification Search
CPC ..... H01L 41/193; H01L 41/29; H01L 41/45; C08G 69/00; C08L 77/04
See application file for complete search history.

(56) References Cited

U.S. PATENT DOCUMENTS

2014/0138654 A1*  5/2014  Ohashi ................. G11C 11/221
                                                              257/40

FOREIGN PATENT DOCUMENTS

| EP | 2 709 147 A1 | 3/2014 |
|---|---|---|
| JP | 63-128317 | 5/1988 |
| JP | 3-156430 | 7/1991 |
| JP | 4-102827 | 4/1992 |
| JP | 8-24625 | 1/1996 |
| JP | 11-217432 | 8/1999 |
| JP | 2005-217111 | 8/2005 |
| WO | WO 2012/153855 | * 11/2012 |
| WO | WO 2012/153855 A1 | 11/2012 |
| WO | WO 2012/153855 A8 | 11/2012 |

OTHER PUBLICATIONS

Extended Search Report issued Oct. 2, 2015 in European Patent Application No. 13748687.4.

* cited by examiner

*Primary Examiner* — Carol M Koslow

(74) *Attorney, Agent, or Firm* — Oblon, McClelland, Maier & Neustadt, L.L.P.

(57) ABSTRACT

Poly($\alpha$-amino acid) which contain: (A) a glutamic acid $\gamma$-ester unit represented by formula (I): and (B) one or more kinds of units selected from a glutamic acid $\gamma$-ester unit represented by formula (II), an alanine unit, a phenylalanine unit and an $N^\epsilon$-benzyloxycarbonyllysine unit, represented by formula (III), and a glutamic acid $\gamma$-ester unit represented by formula (IV) can be dissolved in various solvents and are useful for preparing piezoelectric elements which exhibit superior piezoelectricity.

15 Claims, 1 Drawing Sheet

PIEZOELECTRIC ELEMENT

CROSS REFERENCES TO RELATED APPLICATIONS

This application is a continuation of International Patent Application No. PCT/JP2013/054240, filed on Feb. 13, 2013, and claims priority to Japanese Patent Application No. 2012-029031, filed on Feb. 14, 2012, both of which are incorporated herein by reference in their entireties.

BACKGROUND OF THE INVENTION

1. Field of the Invention

The present invention relates to piezoelectric elements which contain a specific poly(α-amino acid).

2. Discussion of the Background

The technique for producing a device on a flexible substrate by printing is called printable electronics. It is one of the next-generation key technologies, and technical development from various viewpoints has been vigorously considered in recent years. Heretofore, technical developments have been tried in driving elements, lighting elements, display elements and the like, and the realization of printing devices has come in sight. However, an appropriate material has not been found for a piezoelectric element as yet, and sufficient technical development has not been made.

A piezoelectric element is an element that converts an exerted force to voltage or a voltage to force. Heretofore, a thin film of a fluorinated polymer such as polyvinylidene fluoride (PVDF), vinylidene fluoride-trifluoroethylene copolymer (P(VDF/TrFE)) and the like has often been used for a piezoelectric element. However, a fluorinated polymer has a poor film-forming ability and causes problems in terms of uniformity of film thickness, smoothness of film surface and the like. To obtain high piezoelectricity, stretching and polarization are necessary, which problematically increases the cost and limits utilizable processes.

On the other hand, JP-A-H11-217432 discloses that a poly(α-amino acid) which takes a helix form can be used as a piezoelectric material without a special treatment. In addition, JP-A-2005-217111 proposes a polymer piezoelectric substance that can be obtained from a poly(α-amino acid).

However, JP-A-H11-217432 does not describe a poly(α-amino acid) with specifically measured piezoelectricity. In addition, the poly(α-amino acid) composed of poly-γ-benzyl-L-glutamate and/or poly-γ-methyl-L-glutamate specifically described in JP-A-H11-217432 and JP-A-2005-217111 shows insufficient piezoelectricity and can only be dissolved in specific solvents. Therefore, they cannot be used as a printable material, which is required to be soluble in various solvents and resins.

SUMMARY OF THE INVENTION

Accordingly, it is one object of the present invention to provide novel poly(α-amino acid)s which show superior piezoelectricity.

It is another object of the present invention to provide novel poly(α-amino acid)s which show superior piezoelectricity and which can be dissolved in various solvents.

It is another object of the present invention to provide novel piezoelectric elements which contain such a poly(α-amino acid).

It is another object of the present invention to provide novel methods of preparing such a piezoelectric element.

These and other objects, which will become apparent during the following detailed description, have been achieved by the inventors' discovery that the above-mentioned object can be achieved by using a specific poly(α-amino acid).

Accordingly, the present invention provides:

(1) A piezoelectric element, comprising a poly(α-amino acid) comprising (A) a glutamic acid γ-ester unit represented by formula (I)

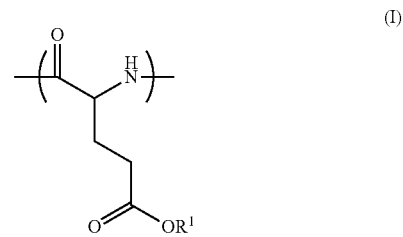

wherein $R^1$ is a methyl group or a benzyl group, and (B) one or more kinds of units selected from a glutamic acid γ-ester unit represented by formula (II), an alanine unit, a phenylalanine unit and an $N^\epsilon$-benzyloxycarbonyllysine unit, which are represented by formula (III), and a glutamic acid γ-ester unit represented by formula (IV):

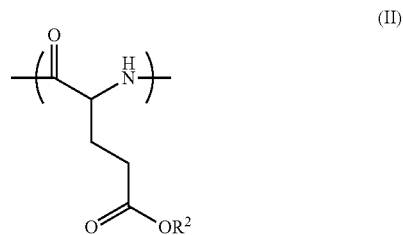

wherein $R^2$ is an unsubstituted alkyl group having 6 to 18 carbon atoms, or a substituted alkyl group having 1 to 6 carbon atoms wherein a hydrogen atom is partly or entirely substituted by a halogen atom or an alicyclic hydrocarbon group having 3 to 12 carbon atoms,

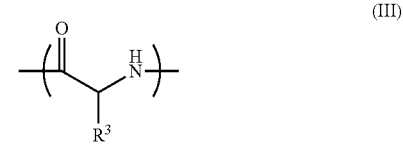

wherein $R^3$ is a methyl group, a benzyl group or a $(CH_2)_4$—NHZ group wherein Z is a benzyloxycarbonyl group,

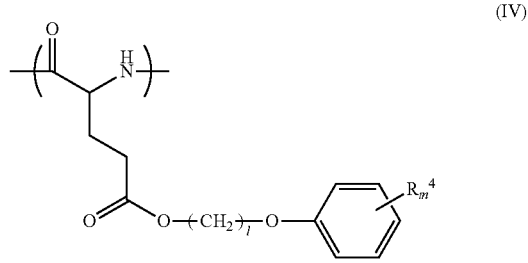

wherein R⁴ is an alkoxy group having 1 to 12 carbon atoms, an alkyl group having 1 to 12 carbon atoms wherein a hydrogen atom is partly or entirely substituted by a halogen atom, or an alkylcarbonyl group wherein an alkyl group has 1 to 12 carbon atoms, R⁴ in the number of m may be the same or different, l is an integer of 6 to 12, and m is an integer of 1 to 3.

(2) The piezoelectric element of the above-mentioned (1), wherein R² is an unsubstituted alkyl group having 6 to 18 carbon atoms, or an alkyl group having 1 to 6 carbon atoms wherein a hydrogen atom is partly or entirely substituted by a fluorine atom or norbornyl group.

(3) The piezoelectric element of the above-mentioned (1) or (2), wherein R² is an n-hexyl group, an n-dodecyl group, an n-hexadecyl group, a 2-norbornylmethyl group or a 2,2,2-trifluoroethyl group.

(4) The piezoelectric element of any one of the above-mentioned (1) to (3), wherein R³ is a (CH₂)₄—NHZ group wherein Z is a benzyloxycarbonyl group.

(5) The piezoelectric element of any one of the above-mentioned (1) to (4), wherein R⁴ is an alkoxy group having 1 to 6 carbon atoms, an alkyl group having 1 to 12 carbon atoms wherein a hydrogen atom is partly or entirely substituted by a fluorine atom, or an alkylcarbonyl group wherein an alkyl group has 3 to 9 carbon atoms.

(6) The piezoelectric element of any one of the above-mentioned (1) to (5), wherein R⁴ is a methoxy group, a butoxy group, a hexyloxy group, an n-hexylcarbonyl group or a trifluoromethyl group.

(7) The piezoelectric element of the above-mentioned (1), wherein the polyamino acid is one or more kinds selected from a γ-methyl-L-glutamic acid/γ-hexyl-L-glutamic acid copolymer, a γ-methyl-L-glutamic acid/γ-dodecyl-L-glutamic acid copolymer, a γ-benzyl-L-glutamic acid/γ-dodecyl-L-glutamic acid copolymer, a γ-methyl-L-glutamic acid/γ-hexadecyl-L-glutamic acid copolymer, a γ-methyl-L-glutamic acid/γ-2,2,2-trifluoroethyl-L-glutamic acid copolymer, a γ-methyl-L-glutamic acid/γ-2-norbornylmethyl-L-glutamic acid copolymer, a γ-benzyl-L-glutamic acid/γ-2-norbornylmethyl-L-glutamic acid copolymer, a γ-methyl-L-glutamic acid/γ-(6-(p-methoxyphenoxy)-1-hexyl)-L-glutamic acid copolymer, a γ-methyl-L-glutamic acid/γ-(6-(p-hexylcarbonylphenoxy)-1-hexyl)-L-glutamic acid copolymer, a γ-methyl-L-glutamic acid/γ-(10-(p-methoxyphenoxy)-1-decyl)-L-glutamic acid copolymer, a γ-methyl-L-glutamic acid/γ-(6-(p-butoxyphenoxy)-1-hexyl)-L-glutamic acid copolymer, a γ-methyl-L-glutamic acid/γ-(6-(p-hexyloxyphenoxy)-1-hexyl)-L-glutamic acid copolymer, a γ-methyl-L-glutamic acid/γ-(6-(3,5-bis(trifluoromethyl)phenoxy)-1-hexyl)-L-glutamic acid copolymer, a γ-methyl-L-glutamic acid/Nᵉ-benzyloxycarbonyl-L-lysine copolymer, a γ-benzyl-L-glutamic acid/Nᵉ-benzyloxycarbonyl-L-lysine copolymer, a γ-methyl-L-glutamic acid/L-phenylalanine copolymer, a γ-benzyl-L-glutamic acid/L-phenylalanine copolymer, and a γ-benzyl-L-glutamic acid/L-alanine copolymer.

(8) The piezoelectric element of any one of the above-mentioned (1) to (7), wherein the poly(α-amino acid) is a random copolymer.

(9) The piezoelectric element of any one of the above-mentioned (1) to (7), wherein the poly(α-amino acid) is a block copolymer.

(10) The piezoelectric element of any one of the above-mentioned (1) to (9), wherein the poly(α-amino acid) has a weight average molecular weight (Mw) of 1,000 to 5,000,000.

(11) The piezoelectric element of any one of the above-mentioned (1) to (10), comprising a flexible substrate, an electrode and the poly(α-amino acid).

(12) The piezoelectric element of any one of the above-mentioned (1) to (11), wherein the poly(α-amino acid) is a thin film.

(13) The piezoelectric element of claim 12), wherein the poly(α-amino acid) is a thin film of 500 nm to 500 μm.

(14) A method of producing the piezoelectric element of any one of the above-mentioned (1) to (13), comprising layering a lower electrode, poly(α-amino acid) and an upper electrode on a flexible substrate.

(15) A polyamino acid-containing ink for the production of the piezoelectric element of any one of the above-mentioned (1) to (13).

According to the present invention, a poly(α-amino acid) having superior piezoelectricity is provided, and a flexible piezoelectric element can be provided at a low cost by printing.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
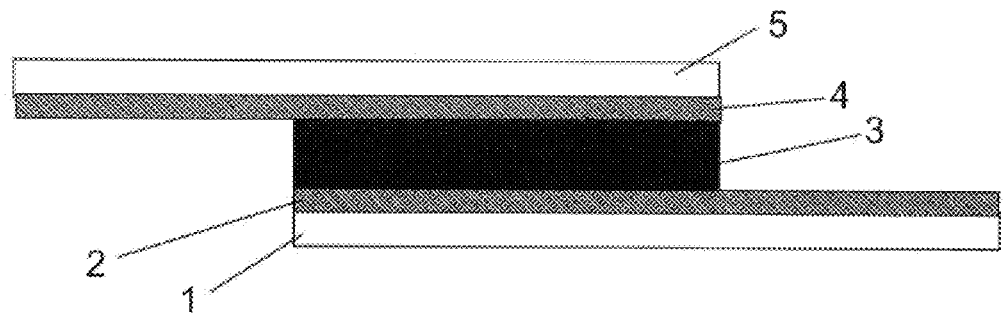
FIG. 1 is a drawing showing one embodiment of a flexible piezoelectric element produced according to the present invention, in which 1 is a flexible substrate, 2 is a lower electrode, 3 is a piezoelectric substance film (poly(α-amino acid)), 4 is an upper electrode, and 5 is another flexible substrate.
Figure 2:
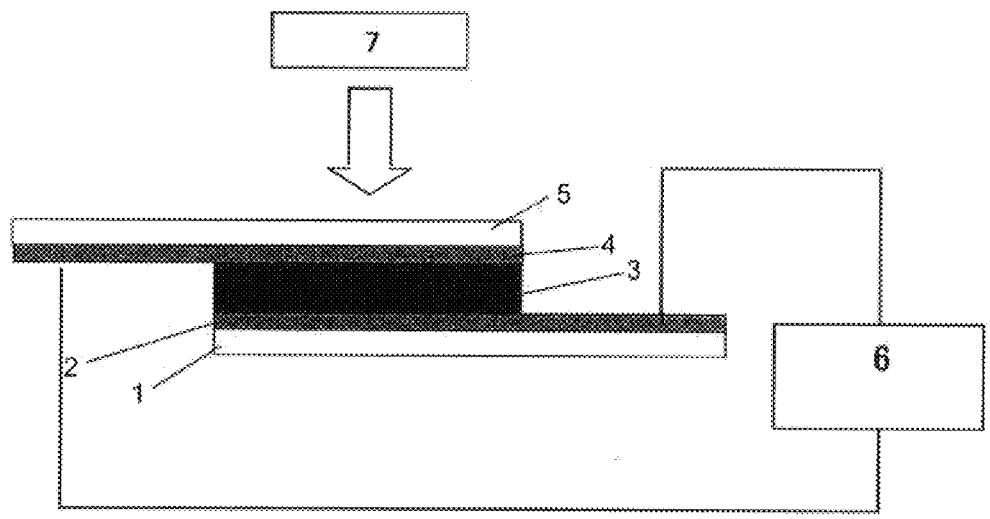
FIG. 2 is a drawing showing an evaluation system of a flexible piezoelectric element produced according to the present invention, in which 1 is a flexible substrate, 2 is a lower electrode, 3 is a piezoelectric substance film (poly(α-amino acid)), 4 is an upper electrode, 5 is another flexible substrate, 6 is a source meter, and 7 is a pressure applying machine.

The present invention is explained in more detail the following. In the present specification, piezoelectricity means the property of generating an electric charge by applying a force and distortion. The term piezoelectric substance means a substance showing piezoelectricity. The term electromotive force means a difference in the electric potential that generates an electric current, and the term maximum electromotive force means the maximum electromotive force generated when a force is applied to a piezoelectric substance. The term electric field means the state of the space where voltage is applied, and the strength thereof can be determined by dividing the voltage by the film thickness. The term piezoelectric element means an element that utilizes piezoelectricity that converts a force exerted on a piezoelectric substance to voltage, or voltage to a force.

Poly(α-amino acid).

The poly(α-amino acid) used in the present invention contains (A) a glutamic acid γ-ester unit represented by formula (I); and (B) one or more kinds of units selected from a glutamic acid γ-ester unit represented by formula (II), an alanine unit, a phenylalanine unit, an Nᵉ-benzyloxycarbonyllysine unit, which are represented by formula (III), and a glutamic acid γ-ester unit represented by formula (IV).

Unit (A).

The unit (A) is a glutamic acid γ-ester unit represented formula (I).

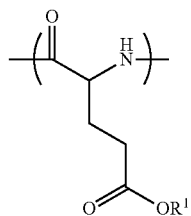

(I)

wherein R¹ is a methyl group or a benzyl group. When R¹ is a methyl group, the unit (A) is a glutamic acid γ-methyl ester unit, and when R¹ is a benzyl group, the unit (A) is a glutamic acid γ-benzyl ester unit. Since good piezoelectricity is obtained, R¹ is preferably a benzyl group.

Unit (B).

The unit (B) is one or more kinds of units selected from a glutamic acid γ-ester unit represented by formula (II), an alanine unit, a phenylalanine unit, and an N$^ε$-benzyloxycarbonyllysine unit, which are represented by formula (III), and a glutamic acid γ-ester unit represented by formula (IV).

Formula (II):

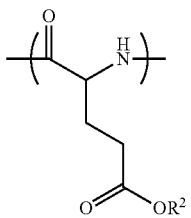

(II)

wherein R² is an unsubstituted alkyl group having 6 to 18 carbon atoms, or a substituted alkyl group having 1 to 6 carbon atoms wherein a hydrogen atom is partly or entirely substituted by a halogen atom or an alicyclic hydrocarbon group having 3 to 12 carbon atoms. Since superior solubility is shown, R² is preferably an unsubstituted alkyl group having 6 to 18 carbon atoms.

In the unit of formula (II), the unsubstituted alkyl group having 6 to 18 carbon atoms for R² is a linear or branched alkyl group, and examples thereof include an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a 3-ethylbutyl group, a 4-ethylbutyl group, a 2-methylpentyl group, a 3-methylpentyl group, a 4-methylpentyl group, a 5-methylpentyl group, a 2-methylhexyl group, a 3-methylhexyl group, a 4-methylhexyl group, a 5-methylhexyl group, a 6-methylhexyl group, a 3-ethylhexyl group, a 4-ethylhexyl group, a 5-ethylhexyl group, a 6-ethylhexyl group, a 4-propylhexyl group, a 5-propylhexyl group, a 6-propylhexyl group, a 5-butylhexyl group, a 6-butylhexyl group, a 6-pentylhexyl group, a 2-methylheptyl group, a 3-ethylheptyl group, a 4-propylheptyl group, a 5-butylheptyl group, a 6-pentylheptyl group, a 7-hexylheptyl group, a 2-methyloctyl group, a 3-ethyloctyl group, a 4-propyloctyl group, a 5-butyloctyl group, a 6-pentyloctyl group, a 7-hexyloctyl group, a 8-heptyloctyl group, a 2-methylnonyl group, a 3-ethylnonyl group, a 4-propylnonyl group, a 5-butylnonyl group, a 6-pentylnonyl group, a 7-hexylnonyl group, a 8-heptylnonyl group, a 2-methyldecyl group, a 2-methylundecyl group, a 2-methyldodecyl group, a 2-methyltridecyl group, a 2-methyltetradecyl group, a 2-methylpentadecyl group, a 3,3-diethylpropyl group, a 2,3-dimethylbutyl group, a 2,4-dimethylbutyl group, a 4,4-dipropylbutyl group, a 2-methyl-3-ethylpentyl group, a 2,3,4-trimethylpentyl group, and a 2-methyl-3-propylhexyl group. Of these, a linear alkyl group is preferable, a linear alkyl group having 6 to 16 carbon atoms is more preferable, a linear alkyl group having 6 to 12 carbon atoms (i.e., n-hexyl group, n-heptyl group, n-octyl group, n-nonyl group, n-decyl group, n-undecyl group, or n-dodecyl group) is more preferable, and an n-hexyl group or an n-dodecyl group is further preferable.

The "alkyl group having 1 to 6 carbon atoms" of the alkyl group having 1 to 6 carbon atoms wherein a hydrogen atom is partly or entirely substituted by a halogen atom or an alicyclic hydrocarbon group having 3 to 12 carbon atoms for R² is a linear or branched alkyl group, and examples thereof include a methyl group, an ethyl group, an n-propyl group, an n-butyl group, an n-pentyl group, an n-hexyl group, an isopropyl group, a sec-butyl group, a tert-butyl group, a 2-methylbutyl group and a 3-ethylbutyl group. Of these, a methyl group, an ethyl group, an n-propyl group or an isopropyl group, each having 1 to 3 carbon atoms, is preferable, and a methyl group or an ethyl group, each having 1 or 2 carbon atoms, is more preferable. The "alicyclic hydrocarbon group having 3 to 12 carbon atoms" may be a saturated hydrocarbon group or an unsaturated hydrocarbon group, and preferably is a saturated hydrocarbon group. Examples thereof include a cyclopropyl group, a cyclobutyl group, a cyclopentyl group, a cyclohexyl group, a cycloheptyl group, a cyclooctyl group, a cyclononyl group, a cyclodecyl group, a cyclohexylcyclohexyl group, a decahydronaphthyl group, a norbornyl group, an adamantyl group and an isobornyl group. Of these, a cyclohexyl group, a cycloheptyl group, a cyclooctyl group or a norbornyl group, each having 6 to 8 carbon atoms, is preferable, and a norbornyl group is more preferable. The "halogen atom" includes a fluorine atom, a chlorine atom, a bromine atom, and an iodine atom. Of these, a fluorine atom is preferable.

Particularly preferable examples of R² include an n-hexyl group, an n-dodecyl group, an n-hexadecyl group, a 2-norbornylmethyl group and a 2,2,2-trifluoroethyl group.

Formula (III):

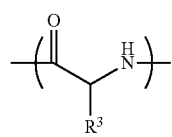

(III)

wherein R³ is a methyl group, a benzyl group or a (CH₂)₄—NHZ group wherein Z is a benzyloxycarbonyl group, hereinafter the same. When R³ is a methyl group, the unit (B) is an alanine unit, when R³ is a benzyl group, the unit (B) is a phenylalanine unit, and when R³ is a (CH₂)₄—NHZ group, the unit (B) is an N$^ε$-benzyloxycarbonyllysine unit. Among these, the N$^ε$-benzyloxycarbonyllysine unit wherein R³ is a (CH₂)₄—NHZ group wherein Z is a benzyloxycarbonyl group is preferable.

Formula (IV):

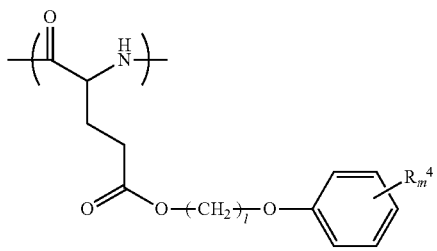

wherein R⁴ is an alkoxy group having 1 to 12 carbon atoms, an alkyl group having 1 to 12 carbon atoms wherein a hydrogen atom is partly or entirely substituted by a halogen atom, or an alkylcarbonyl group wherein an alkyl group has 1 to 12 carbon atoms.

The alkoxy group having 1 to 12 carbon atoms for $R^4$ in the formula (IV) is a linear or branched alkoxy group, and examples thereof include a methoxy group, an ethoxy group, an n-propoxy group, an n-butoxy group, an n-pentyloxy group, an n-hexyloxy group, an n-heptyloxy group, an n-octyloxy group, an n-nonyloxy group, an n-decyloxy group, an n-undecyloxy group, an n-dodecyloxy group, an isopropoxy group, a sec-butoxy group, a tert-butoxy group, a 2-ethylhexyloxy group, and a tert-octyloxy group. Of these, an alkoxy group having 1 to 6 carbon atoms, that is, a methoxy group, an ethoxy group, an n-propoxy group, an n-butoxy group, an n-pentyloxy group, an n-hexyloxy group, an isopropoxy group, a sec-butoxy group, or a tert-butoxy group is preferable, and a methoxy group, an n-butoxy group, or an n-hexyloxy group is more preferable.

The alkyl group having 1 to 12 carbon atoms wherein a hydrogen atom is partly or entirely substituted by a halogen atom for $R^4$ is a linear or branched alkyl group, and the halogen atom includes a fluorine atom, a chlorine atom, a bromine atom, and an iodine atom, preferably a fluorine atom. Examples of the halogen-substituted alkyl group include a monofluoromethyl group, a difluoromethyl group, a trifluoromethyl group, a trifluoroethyl group, a trifluorodimethylethyl group, a hexafluoroisopropyl group, a pentafluoroethyl group, a trifluorobutyl group, a pentafluorobutyl group, a heptafluorobutyl group, a nonafluorobutyl group, a trifluoropentyl group, a trifluoroheptyl group, a trifluorooctyl group, a trifluorononyl group, a trifluorodecyl group, a trifluoroundecyl group, a trifluorododecyl group, a pentafluoropentyl group, a heptafluoropentyl group, an octafluoropentyl group, a nonafluoropentyl group, a dodecafluorohexyl group, a tridecafluorohexyl group, a heptadecafluorooctyl group, a henicosafluoroundecyl group, a heptadecafluoroundecyl group, a henicosafluorodecyl group, a henicosafluorododecyl group, a trichloromethyl group, a trichloroethyl group, a tribromomethyl group, a tribromoethyl group, a triiodomethyl group, and a triiodoethyl group. Of these, a trifluoromethyl group or a trifluoroethyl group is preferable, and a trifluoromethyl group is more preferable.

The alkylcarbonyl group wherein an alkyl group has 1 to 12 carbon atoms for $R^4$ is linear or branched, and examples thereof include methylcarbonyl, ethylcarbonyl, n-propylcarbonyl, isopropylcarbonyl, n-butylcarbonyl, isobutylcarbonyl, tert-butylcarbonyl, sec-butylcarbonyl, n-pentylcarbonyl, isopentylcarbonyl, neopentylcarbonyl, n-hexylcarbonyl, isohexylcarbonyl, 3-methylpentylcarbonyl, n-heptylcarbonyl, n-octylcarbonyl, n-nonylcarbonyl, n-decylcarbonyl, n-undecylcarbonyl, and n-dodecylcarbonyl. Of these, n-propylcarbonyl, isopropylcarbonyl, n-butylcarbonyl, isobutylcarbonyl, tert-butylcarbonyl, sec-butylcarbonyl, n-pentylcarbonyl, isopentylcarbonyl, neopentylcarbonyl, n-hexylcarbonyl, isohexylcarbonyl, n-heptylcarbonyl, or n-octylcarbonyl is preferable, wherein an alkyl group has 3 to 9 carbon atoms. n-Hexylcarbonyl is more preferable.

As a preferable example for $R^4$, an alkoxy group having 1 to 6 carbon atoms, an alkyl group having 1 to 12 carbon atoms wherein a hydrogen atom is partly or entirely substituted by a fluorine atom or an alkylcarbonyl group having 3 to 9 carbon atoms can be mentioned. As a particularly preferable example for $R^4$, a methoxy group, an n-butoxy group, an n-hexyloxy group, a trifluoromethyl group or an n-hexylcarbonyl group can be mentioned.

Subsrcipt l in formula (IV) is an integer of 6 to 12, preferably 6 to 10. In addition, m is an integer of 1 to 3, preferably 1 or 2. When m is 2 or 3, each $R^4$ in the number of 2 or 3 may be the same or different, preferably the same.

Preferred as the poly(α-amino acid) of the present invention is a γ-methyl-L-glutamic acid/γ-hexyl-L-glutamic acid copolymer, a γ-methyl-L-glutamic acid/γ-dodecyl-L-glutamic acid copolymer, a γ-benzyl-L-glutamic acid/γ-dodecyl-L-glutamic acid copolymer, a γ-methyl-L-glutamic acid/γ-hexadecyl-L-glutamic acid copolymer, a γ-methyl-L-glutamic acid/γ-2,2,2-trifluoroethyl-L-glutamic acid copolymer, a γ-methyl-L-glutamic acid/γ-2-norbornylmethyl-L-glutamic acid copolymer, a γ-benzyl-L-glutamic acid/γ-2-norbornylmethyl-L-glutamic acid copolymer, a γ-methyl-L-glutamic acid/γ-(6-(p-methoxyphenoxy)-1-hexyl)-L-glutamic acid copolymer, a γ-methyl-L-glutamic acid/γ-(6-(p-hexylcarbonylphenoxy)-1-hexyl)-L-glutamic acid copolymer, a γ-methyl-L-glutamic acid/γ-(10-(p-methoxyphenoxy)-1-decyl)-L-glutamic acid copolymer, a γ-methyl-L-glutamic acid/γ-(6-(p-butoxyphenoxy)-1-hexyl)-L-glutamic acid copolymer, a γ-methyl-L-glutamic acid/γ-(6-(p-hexyloxyphenoxy)-1-hexyl)-L-glutamic acid copolymer, a γ-methyl-L-glutamic acid/γ-(6-(3,5-bis(trifluoromethyl)phenoxy)-1-hexyl)-L-glutamic acid copolymer, a γ-methyl-L-glutamic acid/N$^\epsilon$-benzyloxycarbonyl-L-lysine copolymer, a γ-benzyl-L-glutamic acid/N$^\epsilon$-benzyloxycarbonyl-L-lysine copolymer, a γ-methyl-L-glutamic acid/γ-hexyl-L-glutamic acid/N$^\epsilon$-benzyloxycarbonyl-L-lysine copolymer, a γ-methyl-L-glutamic acid/L-phenylalanine copolymer, a γ-benzyl-L-glutamic acid/L-phenylalanine copolymer, or a γ-benzyl-L-glutamic acid/L-alanine copolymer.

More preferred is a γ-methyl-L-glutamic acid/γ-hexyl-L-glutamic acid copolymer, a γ-methyl-L-glutamic acid/γ-dodecyl-L-glutamic acid copolymer, a γ-benzyl-L-glutamic acid/γ-dodecyl-L-glutamic acid copolymer, a γ-methyl-L-glutamic acid/γ-hexadecyl-L-glutamic acid copolymer, a γ-methyl-L-glutamic acid/γ-2-norbornylmethyl-L-glutamic acid copolymer, a γ-benzyl-L-glutamic acid/γ-2-norbornylmethyl-L-glutamic acid copolymer, or a γ-methyl-L-glutamic acid/N$^\epsilon$-benzyloxycarbonyl-L-lysine copolymer.

In the poly(α-amino acid) of the present invention, the α-amino acid constituting the units of the formula (I) through formula (IV) may be each an L form or a D form, preferably an L form at a low cost.

As the polymer structure, the unit (A) may be one kind or plural kinds. The unit (B) may be one or plural kinds. Furthermore, the formulas (I) through (IV) of the unit (B) may be one kind or plural kinds. The N-terminal may be either the unit (A) or the unit (B). An initiator may or may not be bonded to the terminal.

The polymer form may be a random copolymer wherein the units (A) and the units (B) are present at random, or a block copolymer comprising a block consisting of the units (A), and a block consisting of the units (B). When the poly(α-amino acid) consists of the unit of the formula (I), and the unit(s) of the formula (II) and/or (IV), a random copolymer is preferable. When the poly(α-amino acid) consists of the unit of the formula (I), and the unit of the formula (III), it may be any of a random copolymer and a block copolymer, and a block copolymer is preferable. As the block copolymer, a diblock copolymer or a triblock copolymer is preferable.

While the content of the unit (A) of the total units of the poly(α-amino acid) varies depending on the kind of the unit (B), 0.01 mol % to 90 mol % is preferable. The upper limit is preferably 85 mol %, more preferably 80 mol %, further preferably 60 mol %. The lower limit is preferably 0.1 mol %, more preferably 1 mol %, further preferably 5 mol %, further preferably 10 mol %, further preferably 15 mol %, further preferably 20 mol %, further preferably 40 mol %.

While the content of the unit (B) of the total units of the poly(α-amino acid) varies depending on the kind of the unit (B), 10 mol % to 99.99 mol % is preferable. The upper limit is preferably 99.9 mol %, more preferably 99 mol %, further preferably 95 mol %, further preferably 90 mol %, further preferably 85 mol %, further preferably 80 mol %, further preferably 60 mol %. The lower limit is more preferably 15 mol %, further preferably 20 mol %, further preferably 40 mol %. When the unit (B) is the unit of formula (IV), the lower limit is preferably 50 mol %, more preferably 60 mol %, further preferably 80 mol %.

As the poly(α-amino acid) consisting of units of formulae (I) and (II), a γ-methyl-L-glutamic acid (15-85 mol %)/γ-hexyl-L-glutamic acid (15-85 mol %) copolymer, a γ-methyl-L-glutamic acid (40-60 mol %)/γ-dodecyl-L-glutamic acid (40-60 mol %) copolymer, a γ-benzyl-L-glutamic acid (40-60 mol %)/γ-dodecyl-L-glutamic acid (40-60 mol %) copolymer, a γ-methyl-L-glutamic acid (15-85 mol %)/γ-hexadecyl-L-glutamic acid (15-85 mol %) copolymer, a γ-methyl-L-glutamic acid (30-70 mol %)/γ-2,2,2-trifluoroethyl-L-glutamic acid (30-70 mol %) copolymer, a γ-methyl-L-glutamic acid (40-60 mol %)/γ-2-norbornylmethyl-L-glutamic acid (40-60 mol %) copolymer, or a γ-benzyl-L-glutamic acid (40-60 mol %)/γ-2-norbornylmethyl-L-glutamic acid (40-60 mol %) copolymer is preferable.

As the poly(α-amino acid) consisting of units of formulae (I) and (III), a γ-methyl-L-glutamic acid (20-80 mol %)/N$^\epsilon$-benzyloxycarbonyl-L-lysine (20-80 mol %) copolymer, a γ-benzyl-L-glutamic acid (40-60 mol %)/N$^\epsilon$-benzyloxycarbonyl-L-lysine (40-60 mol %) copolymer, a γ-methyl-L-glutamic acid (40-60 mol %)/L-phenylalanine (40-60 mol %) copolymer, a γ-benzyl-L-glutamic acid (40-60 mol %)/L-phenylalanine (40-60 mol %) copolymer, or a γ-benzyl-L-glutamic acid (40-60 mol %)/L-alanine (40-60 mol %) copolymer is preferable.

As the poly(α-amino acid) consisting of units of formulae (I), (II), and (III), a γ-methyl-L-glutamic acid (20-30 mol %)/γ-hexyl-L-glutamic acid (20-30 mol %)/N$^\epsilon$-benzyloxycarbonyl-L-lysine (40-60 mol %) copolymer is preferable.

As the poly(α-amino acid) consisting of units of formulae (I) and (IV), a γ-methyl-L-glutamic acid (<1 mol %)/γ-(6-(p-methoxyphenoxy)-1-hexyl)-L-glutamic acid (>99 mol %) copolymer, a γ-methyl-L-glutamic acid (<1 mol %)/γ-(6-(p-hexylcarbonylphenoxy)-1-hexyl)-L-glutamic acid (>99 mol %) copolymer, a γ-methyl-L-glutamic acid (<1 mol-16 mol %)/γ-(10-(p-methoxyphenoxy)-1-decyl)-L-glutamic acid (84->99 mol %) copolymer, a γ-methyl-L-glutamic acid (<1 mol-8 mol %)/γ-(6-(p-butoxyphenoxy)-1-hexyl)-L-glutamic acid (92->99 mol %) copolymer, a γ-methyl-L-glutamic acid (<1 mol-14 mol %)/γ-(6-(p-hexyloxyphenoxy)-1-hexyl)-L-glutamic acid (86->99 mol %) copolymer, a γ-methyl-L-glutamic acid (<1 mol-8 mol %)/γ-(6-(3,5-bis(trifluoromethyl)phenoxy)-1-hexyl-L-glutamic acid (92->99 mol %) copolymer, or the like is preferable.

While the molecular weight of the poly(α-amino acid) is not particularly limited, the weight average molecular weight (Mw) is preferably 1,000 to 5,000,000, more preferably 5,000 to 2,500,000, further preferably 10,000 to 2,000,000, to obtain poly(α-amino acid) suitable for film formation, wherein intermolecular interaction is appropriately controlled to express piezoelectricity.

The preparation method of the poly(α-amino acid) of the present invention is not particularly limited. For example, a method wherein N-carboxy-α-glutamic acid γ-methyl ester anhydride or N-carboxy-α-glutamic acid γ-benzyl ester anhydride to be unit (A), and N-carboxy-α-amino acid anhydride or N-carboxy-α-amino acid ester derivative anhydride to be unit (B) are appropriately mixed and dissolved or suspended in an organic solvent or water and, where necessary, a polymerization initiator is added to allow for copolymerization can be mentioned. In the case of a poly(α-amino acid) consisting of the units of formula (I) and formula (II) and/or (IV), a method wherein N-carboxy-α-glutamic acid anhydride or N-carboxy-α-glutamic acid γ-ester anhydride is dissolved or suspended in an organic solvent or water and, where necessary, a polymerization initiator is added to allow for copolymerization to prepare poly(α-glutamic acid) or poly(α-glutamic acid γ-ester), an appropriate amount of one or more kinds of specific alcohol to be the starting material is added to the glutamic acid unit of poly(α-glutamic acid) or poly(α-glutamic acid γ-ester) and, where necessary, a catalyst is added to introduce an ester into the γ-position or convert an ester at the γ-position can be mentioned.

Examples of the aforementioned organic solvent include acetone, methyl ethyl ketone, methyl isobutyl ketone, cyclohexanone, tetrahydrofuran, diethyl ether, diisopropyl ether, petroleum ether, 1,4-dioxane, benzene, toluene, xylene, hexane, cyclohexane, ethyl acetate, butyl acetate, trifluoroacetic acid, acetic acid, formic acid, dichloromethane, chloroform, carbon tetrachloride, 1,2-dichloroethane, trichloroethane, trichloroethylene, trifluoroethane, 1,1,1,3,3,3-hexafluoro-2-propanol, 2,2,2-trifluoroethanol, hexafluoroacetone, methanol, ethanol, 1-propanol, 2-propanol, formamide, N,N-dimethylformamide, N,N-dimethylacetamide, N-methylpyrrolidone, dimethyl sulfoxide, pyridine, acetonitrile, trimethylamine, triethylamine, and tributylamine. One or more kinds of organic solvents can be used in combination.

Examples of the aforementioned polymerization initiator include primary diamines such as ethylenediamine, propylenediamine, hexamethylenediamine, 1,4-cyclohexanediamine, 1,2-cyclohexanediamine, o-phenylenediamine, m-phenylenediamine, p-phenylenediamine, toluene-2,4-diamine, 4,4'-diphenylmethanediamine, isophoronediamine and the like; primary monoamines such as methylamine, ethylamine, and 1-propylamine, and the like; alcohol amines such as methanolamine, ethanolamine, diethanolamine and the like; secondary amine such as dimethylamine, diethylamine, dipropylamine, and the like; primary tertiary diamines such as N,N-dimethylethylenediamine, N,N-dimethyl-1,3-propanediamine, and the like; tertiary amines such as trimethylamine, triethylamine, tributylamine, and the like; amino group-containing polymers such as polyetherdiamine, polyester diamine, and the like; primary alcohols such as methanol, ethanol, and the like; secondary alcohols such as isopropanol and the like; glycols such as ethylene glycol, propylene glycol, 1,4-butanediol, hexamethylene glycol, and the like; hydroxyl group-containing polymers such as polyether diol, polyester diol, and the like; thiols and the like. One or more kinds polymerization initiators can be used in combination.

Examples of the aforementioned catalyst include hydrochloric acid, sulfuric acid, nitric acid, p-toluenesulfonic acid, sodium hydroxide, potassium hydroxide, sodium methoxide, sodium t-butoxide, potassium methoxide, potassium t-butoxide, potassium cyanide, carbon dioxide, titanium (IV) tetraisopropoxide, 1,3-substituted tetraalkyldistannoxane tin (IV) complex, tetracyanoethylene, 4-dimethylaminopyridine, and diphenylammonium triflate-trimethylsilyl chloride. One or more kinds of catalysts can be used in combination.

While the amount of the catalyst is appropriately determined according to the reaction, generally, it can be appropriately selected from the range where an appropriate reaction time is realized, and removal of the catalyst after reaction is not difficult. For example, it is 0.0001 to 1 equivalents, preferably 0.01 to 0.75 equivalents, more preferably 0.1 to 0.5 equivalents, relative to the mole number of amino acid anhydride to be used.

While the amount of alcohol to be the starting material is appropriately determined according to the reaction, generally, it can be appropriately selected from the range where the conversion of the side chain is sufficiently performed and removal of unreacted alcohol is not difficult. For example, it is 0.01 to 50 equivalents, preferably 0.1 to 25 equivalents, more preferably 0.15 to 20 equivalents, relative to the glutamic acid units of poly($\alpha$-amino acid).

Piezoelectric Element.

The present invention provides a piezoelectric element containing the above-mentioned poly($\alpha$-amino acid). It is preferable to prepare poly($\alpha$-amino acid) as a thin film and use same as a piezoelectric substance film. The piezoelectric element has a poly($\alpha$-amino acid) piezoelectric substance film and an electrode on a substrate, preferably a flexible substrate.

A particularly preferable specific example of the element is shown in FIG. 1. An element in the form of a flexible substrate, 1, a lower electrode, 2, a piezoelectric substance film of the above-mentioned poly($\alpha$-amino acid), 3, an upper electrode, 4, and another flexible substrate, 5, can be mentioned.

A method of forming a piezoelectric substance film of poly($\alpha$-amino acid) is not particularly limited, and any method may be used. While a spin coat method, dip coat method and cast method are most often used conveniently, since pattern control is necessary, printing techniques such as screen printing, gravure printing, offset printing, flexographic printing, ink jet printing, and the like using an ink containing poly($\alpha$-amino acid) can also be used. In addition, a printing method called soft lithograph such as microcontact printing, micromolding and the like can also be adopted.

For example, the poly($\alpha$-amino acid) can be dissolved in an appropriate organic solvent, the polymer solution (poly ($\alpha$-amino acid)-containing ink) is processed into a thin film by spin coat or cast and the like, and dried to form the film. The drying method is not particularly limited, and various methods such as drying by a standing treatment, drying by fan dryer and the like can be used. As an organic solvent to be used for spin coat and cast, various solvents can be used, and examples thereof include nitrogen-containing polar solvents such as N-methylpyrrolidone, N,N-dimethylformamide, N,N-dimethylacetamide, and the like; sulfoxide and sulfone solvents such as dimethyl sulfoxide, dimethyl sulfone, and the like; ketone solvents such as acetone, methyl ethyl ketone, diethylketone, acetophenone, cyclohexanone, and the like; ether solvents such as dimethyl ether, dipropyl ether, tetrahydrofuran, triethylene glycol dimethyl ether, and the like; benzoic acid ester solvents such as methyl benzoate, benzoic acid ether, butyl benzoate, and the like; halogenated solvents such as chloroform, methylene chloride, trichloroethylene, ethylene dichloride, dichloroethane, tetrachloroethane, chlorobenzene, and the like; alcohol phenol solvents such as methanol, ethanol, propanol, butanol, pentanol, ethylene glycol, propylene glycol, phenol, cresol, polyethylene glycol, and the like; fluorine-containing branched alcohol solvents such as perfluoro-tert-butanol, hexafluoro-2-methylisopropanol, 1,1,1,3,3,3-hexafluoroisopropanol, and the like; and aromatic hydrocarbon solvents such as benzene, toluene, and xylene and the like. The organic solvent may be used alone or two or more kinds thereof may be used in a mixture. Among these, chloroform, 1,1,1,3,3,3-hexafluoroisopropanol, methylene chloride, dichloroethane, N-methylpyrrolidone, N,N-dimethylacetamide, methyl ethyl ketone, cyclohexanone, methyl benzoate, or toluene is preferable. When a film is produced by a cast method, the concentration of the solution (ink) is not particularly limited as long as uniform film forming can be achieved. It is preferably 1 to 50% (w/w), more preferably 5 to 25% (w/w). While the film forming temperature is not particularly limited, it is preferably 10 to 150° C., more preferably 20 to 100° C.

The thickness of a piezoelectric substance film containing the poly($\alpha$-amino acid) is preferably 500 nm to 500 µm, more preferably 1 to 100 µm, further preferably 10 to 80 µm.

A composite piezoelectric substance film can be produced using the poly($\alpha$-amino acid) in the present invention, and other materials having piezoelectricity, for example, a ceramic piezoelectric material or an organic piezoelectric material. For example, a method for forming a thin film by blending the ceramic piezoelectric material or organic piezoelectric material, or a method for layering a piezoelectric substance film can be mentioned.

As the ceramic piezoelectric material, lead zirconate titanate (PZT), natural or artificial quartz crystal, lithium niobate (LiNbO$_3$), potassium tantalate niobate [K(Ta,Nb)O$_3$], barium titanate (BaTiO$_3$), lithium tantalate (LiTaO$_3$), and strontium titanate (SrTiO$_3$) can be mentioned. As the organic piezoelectric material, acetyl cellulose, cyanoethyl cellulose polypropylene oxide, poly($\beta$-hydroxybutyric acid), polyvinylidene fluoride, a vinylidene fluoride-trifluoroethylene copolymer, a vinylidene fluoride-tetrafluoroethylene copolymer, a vinylidene cyanide-vinyl acetate copolymer and nylon 11 can be mentioned. The composition of various ceramic materials and organic materials can be appropriately selected in consideration of the use properties thereof.

The poly($\alpha$-amino acid) of the present invention can optionally contain various resins and additives other than those mentioned above, within the range permitting exertion of the effect as a piezoelectric substance film. Examples of the resin additive include inorganic fillers such as silica, talc, barium sulfate, and the like; colorants such as a pigment, dye, and the like; organic fillers such as carbon black, silicon powder, nylon powder, fluorinated powder and the like;

thickeners such as Orben, Benton, and the like, silicone-based, fluorinated, polymer-based antifoaming agents or leveling agents, silane coupling agents, thermosetting resins such as epoxy resin, acrylic resin, phenol resin, isocyanate resin, cyanate ester resin and the like, adhesion-imparting agents such as triazole compound, thiazole compound, triazine compound, porphyrin compound and the like, rubber particles, maleimide compounds, bisallyl nadimide compounds, vinylbenzyl resins, vinyl benzyl ether resins and the like.

The substrate is not particularly limited, and glass substrates such as quartz and the like; semiconductor substrates such as silicon wafer and the like; rigid plastic substrates such as paper epoxy, glass epoxy, and the like; flexible plastic substrates such as polycarbonate, polyimide, poly (ethylene terephthalate) (PET), and the like; and paper can be mentioned.

As a material of the electrodes, metals such as gold, silver, copper, indium tin oxide (ITO) and the like are often used; however, the material is not limited thereto. The production method thereof is not particularly limited, and any method may be used. A generally-used method is photolithography of copper foil, plating wiring and the like. A wet production process including application or attachment of a solution by typographic printing, screen printing, ink jet printing and the like, and the like are also applied. In this case, silver paste, and an electrode made of organic materials such as thiophene-based conductive polymer (PEDOT), polyaniline and derivatives thereof and the like can be used. In addition, dry production processes different from the above such as vacuum vapor deposition method, sputtering method and the like can also be applied. To achieve stabilization of the element, prolongation of life thereof, efficient high electric charge injection and the like, the electrode may be formed from a mixture of plural substances, a layer structure of several kinds of substances may be employed, or a surface treatment may be applied.

The present invention has enabled the formation of a piezoelectric element by a printing method. Since the piezoelectric element of the present invention provides an unprecedented economical flexible piezoelectric element, it is useful in the fields of pressure sensors, distortion sensors, position sensors, speakers, microphones, measuring instruments, piezoelectric vibrators, actuators, and the like.

When provided along the surface layer of a part subject to a load, for example, a bed, mat, chair (sofa, wheelchair, seat of vehicle including automobile, railway vehicle, aircraft and the like)) and the like, the body pressure can be measured, the pressure ulcer can be prevented and the like. In addition, by analyzing the numbers of the pressure sensor, pulse, respiration and the like can be sensed and physical condition and the like can be databased. Also, a sheet pressure measuring instrument such as a foot pressure measurement sheet (sheet for measuring which partial region of the sole of foot conveys what level of load to the ground), a dental occlusion measuring instrument (sheet for measuring which tooth causes action of what compression load to the target by being bitten by the teeth) and the like can be constituted.

Other features of the invention will become apparent in the course of the following descriptions of exemplary embodiments which are given for illustration of the invention and are not intended to be limiting thereof.

EXAMPLES

Synthesis of the Poly(α-amino acid)

Synthetic Example 1

Synthesis of γ-methyl-L-glutamic acid/γ-hexyl-L-glutamic acid copolymer

Step 1. Synthesis of poly-γ-methyl-L-glutamic acid

To 1,2-dichloroethane (410 ml, manufactured by Kanto Chemical CO., Inc.) was added N-carboxy-γ-methyl-L-glutamic acid anhydride (54.92 g, 293.45 mmol), and the mixture was cooled to 0° C. As an initiator, N,N-dimethyl-1,3-propanediamine (366 µl, 2.93 mmol, manufactured by Kanto Chemical CO., Inc.) was added, and the mixture was stirred at 25° C. for 1 day to give poly-γ-methyl-L-glutamic acid. The weight average molecular weight, Mw, was measured by Measurement Method 1 described below. The weight average molecular weight, Mw, was $1.9 \times 10^4$.

Step 2. Side chain substitution reaction of poly-γ-methyl-L-glutamic acid (transesterification reaction)

The poly-γ-methyl-L-glutamic acid (9.3 g) prepared above was dissolved in 1,2-dichloroethane (45 ml), 1-hexanol (16 ml, 130.00 mmol, manufactured by Tokyo Chemical Industry Co., Ltd.) and p-toluenesulfonic acid monohydrate (1.24 g, 6.50 mmol, manufactured by Tokyo Chemical Industry Co., Ltd.) were added. The mixture was stirred at 80° C. for 1 day to perform a transesterification reaction to give a γ-methyl-L-glutamic acid/γ-hexyl-L-glutamic acid copolymer. The weight average molecular weight, Mw, was measured by Measurement Method 1 described below. In addition, the composition of the polymer after transesterification reaction was measured by Measurement Method 2 described below.

Synthetic Examples 2, 3, 5 to 7, and 9 to 14

Synthesis of various poly(α-amino acids)

By a method similar to that of Synthetic Example 1, poly-γ-methyl-L-glutamic acid was obtained, which was dissolved in 1,2-dichloroethane. An appropriate amount of the alcohol shown in Table 1 (in introduced alcohol) was added to the glutamic acid unit of poly-γ-methyl-L-glutamic acid, a catalytic amount of p-toluenesulfonic acid monohydrate was added, and the mixture was stirred for 1 to 5 days to give various poly(α-amino acids) (copolymers). The weight average molecular weights, Mw, of the obtained copolymers were measured by Measurement Method 1 described below. In addition, the compositions of the polymers after transesterification reaction were measured by Measurement Method 2 described below.

Synthetic Example 4

Synthesis of γ-benzyl-L-glutamic acid/γ-dodecyl-L-glutamic acid copolymer

Step 1. Synthesis of poly-γ-benzyl-L-glutamic acid

To 1,2-dichloroethane (265 ml, manufactured by Kanto Chemical CO., Inc.) were added N-carboxy-γ-benzyl-L- glutamic acid anhydride (44.2 g, 167.98 mmol) and N,N-dimethyl-1,3-propanediamine (208.2 μl, 1.68 mmol) as initiators, and the mixture was stirred at 25° C. for 3 days to give poly-γ-benzyl-L-glutamic acid. The weight average molecular weight, Mw, was measured by Measurement Method 1 described below. The weight average molecular weight, Mw, was 2.2×10⁴.

Step 2. Side chain substitution reaction of poly-γ-benzyl-L-glutamic acid (transesterification reaction)

The poly-γ-benzyl-L-glutamic acid (10 g, 45.6 mmol) prepared above was dissolved in 1,2-dichloroethane (170 ml), 1-dodecanol (10.2 ml, 45.6 mmol, manufactured by Tokyo Chemical Industry Co., Ltd.) and p-toluenesulfonic acid monohydrate (2.6 g, 13.68 mmol) were added, and the mixture was stirred at 65° C. for 1 day to give a γ-benzyl-L-glutamic acid/γ-dodecyl-L-glutamic acid copolymer. The weight average molecular weight, Mw, of the obtained copolymer was measured by Measurement Method 1 described below. In addition, the composition of the polymer after transesterification reaction was measured by Measurement Method 2 described below.

Synthetic Example 8

Synthesis of γ-benzyl-L-glutamic acid/γ-2-norbornylmethyl-L-glutamic acid copolymer By a method similar to that of Synthetic Example 4, poly-γ-benzyl-L-glutamic acid was obtained and dissolved in 1,2-dichloroethane. Thereto were added an equivalent amount of norbornane-2-methanol (manufactured by Tokyo Chemical Industry Co., Ltd.) relative to the glutamic acid unit of poly-γ-benzyl-L-glutamic acid and a catalytic amount of p-toluenesulfonic acid monohydrate, and the mixture was stirred at 65° C. for 4 days to give a γ-benzyl-L-glutamic acid/γ-2-norbornylmethyl-L-glutamic acid copolymer. The weight average molecular weight, Mw, of the obtained copolymer was measured by Measurement Method 1 described below. In addition, the composition of the polymer after transesterification reaction was measured by Measurement Method 2 described below.

TABLE 1

| | polymer (composition:mol %) | introduced alcohol | Mw | substitution rate (mol %) |
|---|---|---|---|---|
| Syn. Ex. 1 | γ-methyl-L-glutamic acid (48%)/γ-hexyl-L-glutamic acid (52%) copolymer | 1-hexanol | 1.5 × 10⁴ | 52 |
| Syn. Ex. 2 | γ-methyl-L-glutamic acid (18%)/γ-hexyl-L-glutamic acid (82%) copolymer | 1-hexanol | 3.2 × 10⁴ | 82 |
| Syn. Ex. 3 | γ-methyl-L-glutamic acid (50%)/γ-dodecyl-L-glutamic acid (50%) copolymer | 1-dodecanol | 2.9 × 10⁴ | 50 |
| Syn. Ex. 4 | γ-benzyl-L-glutamic acid (60%)/γ-dodecyl-L-glutamic acid (40%) copolymer | 1-dodecanol | 2.0 × 10⁴ | 40 |
| Syn. Ex. 5 | γ-methyl-L-glutamic acid (17%)/γ-hexadecyl-L-glutamic acid (83%) copolymer | 1-hexadecanol | 4.4 × 10⁴ | 83 |
| Syn. Ex. 6 | γ-methyl-L-glutamic acid (67%)/γ-2,2,2-trifluoroethyl-L-glutamic acid (33%) copolymer | 2,2,2-trifluoroethanol | 3.2 × 10⁴ | 33 |
| Syn. Ex. 7 | γ-methyl-L-glutamic acid (40%)/γ-2-norbornylmethyl-L-glutamic acid (60%) copolymer | norbornane-2-methanol | 2.6 × 10⁴ | 60 |
| Syn. Ex. 8 | γ-benzyl-L-glutamic acid (55%)/γ-2-norbornylmethyl-L-glutamic acid (45%) copolymer | norbornane-2-methanol | 2.2 × 10⁴ | 45 |
| Syn. Ex. 9 | γ-methyl-L-glutamic acid (<1%)/γ-(6-(p-methoxyphenoxy)-1-hexyl)-L-glutamic acid (>99%) polymer | 6-p-methoxyphenoxy-1-hexanol | 1.1 × 10⁵ | — |
| Syn. Ex. 10 | γ-methyl-L-glutamic acid (<1%)/γ-(6-(p-hexylcarbonylphenoxy)-1-hexyl)-L-glutamic acid (>99%) polymer | 6-p-hexylcarbonyl-phenoxy-1-hexanol | 9.6 × 10⁴ | — |
| Syn. Ex. 11 | γ-methyl-L-glutamic acid (16%)/γ-(10-(p-methoxyphenoxy)-1-decyl)-L-glutamic acid (84%) copolymer | 10-p-methoxyphenoxy-1-decanol | 1.2 × 10⁵ | 84 |
| Syn. Ex. 12 | γ-methyl-L-glutamic acid (8%)/γ-(6-(p-butoxyphenoxy)-1-hexyl)-L-glutamic acid (92%) copolymer | 6-p-butoxyphenoxy-1-hexanol | 1.7 × 10⁵ | 92 |
| Syn. Ex. 13 | γ-methyl-L-glutamic acid (14%)/γ-(6-(p-hexyloxyphenoxy)-1-hexyl)-L-glutamic acid (86%) copolymer | 6-p-hexyloxyphenoxy-1-hexanol | 1.9 × 10⁵ | 86 |
| Syn. Ex. 14 | γ-methyl-L-glutamic acid (8%)/γ-(6-(3,5-bis(trifluoromethyl)phenoxy)-1-hexyl)-L-glutamic acid (92%) copolymer | 6-(3,5-bis(trifluoromethyl)phenoxy)-1-hexanol | 5.0 × 10⁴ | 92 |

Synthetic Example 15

Synthesis of γ-methyl-L-glutamic acid/N$^\epsilon$-benzyloxycarbonyl-L-lysine copolymer To 1,2-dichloroethane (130 ml) were added N$^\alpha$-carboxy-N$^\epsilon$-benzyloxycarbonyl-L-lysine anhydride (4.02 g, 13.12 mmol) and N-carboxy-γ-methyl-L-glutamic acid anhydride (2.46 g, 13.12 mmol), N,N-dimethyl-1,3-propanediamine (32.78 μl, 0.262 mmol) was added as an initiator, and the mixture was stirred at 25° C. for 1 day to give a γ-methyl-L-glutamic acid/N$^\epsilon$-benzyloxycarbonyl-L-lysine copolymer. The weight average molecular weight, Mw, of the copolymer was measured by Measurement Method 1 described below. In addition, the composition of the copolymer was measured by Measurement Method 2 described below.

Synthetic Examples 16 to 19

Synthesis of Various Copolymers

In the same manner as in Synthetic Example 14, equimolar amounts of two kinds of N-carboxy-L-amino acid anhydrides (component A, component B) shown in Table 2 were added to 1,2-dichloroethane, 1/100 equivalent amount of N,N-dimethyl-1,3-propanediamine relative to amino acid anhydride was added as an initiator, and the mixture was stirred for 2 to 3 days to give various polyamino acid copolymers. The weight averages molecular weight, Mw, of the copolymers were measured by Measurement Method 1 described below. In addition, the compositions of the copolymers were measured by Measurement Method 2 described below.

TABLE 2

| polymer (composition:mol %) | N-carboxy-L-amino acid anhydride | | Mw |
|---|---|---|---|
| | component A | component B | |
| Syn. Ex. 15 | γ-methyl-L-glutamic acid (47%)/N$^\epsilon$-benzyloxycarbonyl-L-lysine (53%) copolymer | γ-methyl-L-glutamic acid | N$^\epsilon$-benzyloxycarbonyl-L-lysine | $5.5 \times 10^4$ |
| Syn. Ex. 16 | γ-benzyl-L-glutamic acid (49%)/N$^\epsilon$-benzyloxycarbonyl-L-lysine (51%) copolymer | γ-benzyl-L-glutamic acid | N$^\epsilon$-benzyloxycarbonyl-L-lysine | $3.8 \times 10^4$ |
| Syn. Ex. 17 | γ-methyl-L-glutamic acid (51%)/L-phenylalanine (49%) copolymer | γ-methyl-L-glutamic acid | L-phenylalanine | $4.0 \times 10^4$ |
| Syn. Ex. 18 | γ-benzyl-L-glutamic acid (48%)/L-phenylalanine (52%) copolymer | γ-benzyl-L-glutamic acid | L-phenylalanine | $1.4 \times 10^5$ |
| Syn. Ex. 19 | γ-benzyl-L-glutamic acid (50%)/L-alanine (50%) copolymer | γ-benzyl-L-glutamic acid | L-alanine | $1.5 \times 10^5$ |

Synthetic Example 20

Synthesis of γ-methyl-L-glutamic acid (68%)-N$^\epsilon$-benzyloxycarbonyl-L-lysine block (32%) copolymer To 1,2-dichloroethane (20 ml) was added N-carboxy-γ-methyl-L-glutamic acid anhydride (5.00 g, 26.72 mmol), and the mixture was cooled to 0° C. N,N-Dimethyl-1,3-propanediamine (66.80 μl, 0.534 mmol) was added as an initiator, and the mixture was stirred at 25° C. for 1 day and cooled again to 0° C. 1,2-Dichloroethane (20 ml) was added, N$^\alpha$-carboxy-N$^\epsilon$-benzyloxycarbonyl-L-lysine anhydride (4.09 g, 13.36 mmol) was added, and the mixture was stirred at 25° C. for 1 day to give a γ-methyl-L-glutamic acid-N$^\epsilon$-benzyloxycarbonyl-L-lysine block copolymer. The weight average molecular weight, Mw, of the copolymer was measured by Measurement Method 1 described below. In addition, the composition of the copolymer was measured by Measurement method 2 described below.

Synthetic Example 21

Synthesis of γ-methyl-L-glutamic acid (41%)-N$^\epsilon$-benzyloxycarbonyl-L-lysine (18%)-γ-methyl-L-glutamic acid (41%) block copolymer In the same manner as in Synthetic Example 20, γ-methyl-L-glutamic acid-N$^\epsilon$-benzyloxycarbonyl-L-lysine block copolymer was obtained and cooled again to 0° C. 1,2-Dichloroethane (10 ml) was added, N-carboxy-γ-methyl-L-glutamic acid anhydride (5.00 g, 26.72 mmol) was added, and the mixture was stirred at 25° C. for 2 days to give a γ-methyl-L-glutamic acid-N$^\epsilon$-benzyloxycarbonyl-L-lysine-γ-methyl-L-glutamic acid block copolymer. The weight average molecular weight, Mw, of the copolymer was measured by Measurement Method 1 described below. In addition, the composition of the copolymer was measured by Measurement Method 2 described below.

Synthetic Example 22

Synthesis of γ-benzyl-L-glutamic acid (50%)-N$^\epsilon$-benzyloxycarbonyl-L-lysine (50%) block copolymer (low molecular weight copolymer)

To 1,2-dichloroethane (10 ml) was added N-carboxy-γ-benzyl-L-glutamic acid anhydride (1.00 g, 3.80 mmol), and the mixture was cooled to 0° C. N,N-Dimethyl-1,3-propanediamine (9.56 μl, 0.076 mmol) was added as an initiator, and the mixture was stirred at 25° C. for 1 day and cooled again to 0° C. N$^\alpha$-Carboxy-N$^\epsilon$-benzyloxycarbonyl-L-lysine anhydride (1.16 g, 3.80 mmol) was added, and the mixture was stirred at 25° C. for 1 day to give a γ-benzyl-L-glutamic acid-N$^\epsilon$-benzyloxycarbonyl-L-lysine block copolymer (low molecular weight copolymer). The weight average molecular weight, Mw, of the copolymer was measured by Measurement Method 1 described below. In addition, the composition of the copolymer was measured by Measurement Method 2 described below.

Synthetic Example 23

Synthesis of N$^\epsilon$-benzyloxycarbonyl-L-lysine (50%)-γ-benzyl-L-glutamic acid (50%) block copolymer (low molecular weight copolymer)

To 1,2-dichloroethane (10 ml) was added Nα-carboxy-N$^\epsilon$-benzyloxycarbonyl-L-lysine anhydride (1.16 g, 3.80 mmol), and the mixture was cooled to 0° C. N,N-Dimethyl-1,3-propanediamine (9.56 μl, 0.076 mmol) was added as an initiator, and the mixture was stirred at 25° C. for 1 day and cooled again to 0° C. N-Carboxy-γ-benzyl-L-glutamic acid anhydride (1.00 g, 3.80 mmol) was added, and the mixture was stirred at 25° C. for 1 day to give a γ-benzyl-L-glutamic acid-N$^\epsilon$-benzyloxycarbonyl-L-lysine block copolymer (low molecular weight copolymer). The weight average molecular weight, Mw, of the copolymer was measured by Measurement Method 1 described below. In addition, the composition of the copolymer was measured by Measurement Method 2 described below.

Synthetic Examples 24 and 25

Synthesis of various poly(α-amino acids)

By a method similar to that of Synthetic Example 22, N-carboxy-γ-benzyl-L-glutamic acid anhydride and Nα-carboxy-N$^\epsilon$-benzyloxycarbonyl-L-lysine anhydride were added in appropriate amounts to give various poly(α-amino acid) block copolymers (low molecular weight copolymers).

Synthetic Example 26

Synthesis of γ-benzyl-L-glutamic acid (53%)-N$^\epsilon$-benzyloxycarbonyl-L-lysine (47%) block copolymer (high molecular weight copolymer)

To 1,2-dichloroethane (10 ml) was added N-carboxy-γ-benzyl-L-glutamic acid anhydride (1.00 g, 3.80 mmol), and the mixture was cooled to 0° C. N,N-Dimethyl-1,3-propanediamine (0.48 μl, 3.8 μmol) was added as an initiator, and the mixture was stirred at 25° C. for 1 day and cooled again to 0° C. N$^\alpha$-Carboxy-N$^\epsilon$-benzyloxycarbonyl-L-lysine anhydride (1.16 g, 3.80 mmol) was added, and the mixture was stirred at 25° C. for 3 days to give a γ-benzyl-L-glutamic acid-N$^\epsilon$-benzyloxycarbonyl-L-lysine block copolymer (high molecular weight copolymer). The weight average molecular weight, Mw, of the copolymer was measured by Measurement Method 1 described below. In addition, the composition of the copolymer was measured by Measurement Method 2 described below.

Synthetic Example 27

γ-methyl-L-glutamic acid (25%)/γ-hexyl-L-glutamic acid (25%)-N$^\epsilon$-benzyloxycarbonyl-L-lysine (50%) block copolymer Step 1. Synthesis of poly-γ-methyl-L-glutamic acid (50%)-N$^\epsilon$-benzyloxycarbonyl-L-lysine (50%) block copolymer By a method similar to that of Synthetic Example 20, a poly-γ-methyl-L-glutamic acid (50%)-N$^\epsilon$-benzyloxycarbonyl-L-lysine (50%) block copolymer was synthesized. The weight average molecular weight, Mw, of the obtained block copolymer was measured by Measurement Method 1 described below. In addition, the composition of the copolymer was measured by Measurement Method 2 described below.

Step 2. Side chain substitution reaction (transesterification reaction) of poly-γ-methyl-L-glutamic acid in poly-γ-methyl-L-glutamic acid (50%)-N$^\epsilon$-benzyloxycarbonyl-L-lysine (50%) block copolymer The poly-γ-methyl-L-glutamic acid (50%)-N$^\epsilon$-benzyloxycarbonyl-L-lysine (50%) block copolymer (5.47 g) prepared above was dissolved in 1,2-dichloroethane (25 ml), 1-hexanol (0.96 ml, 19.50 mmol, manufactured by Tokyo Chemical Industry Co., Ltd.) and p-toluenesulfonic acid monohydrate (0.075 g, 0.39 mmol, manufactured by Tokyo Chemical Industry Co., Ltd.) were added, and the mixture was stirred at 80° C. for 1 day to perform transesterification reaction to give a γ-methyl-L-glutamic acid/γ-hexyl-L-glutamic acid copolymer. The weight average molecular weight, Mw, of the obtained copolymer was measured by Measurement Method 1 described below. In addition, the composition of the polymer after the transesterification reaction was measured by Measurement Method 2 described below.

TABLE 3

| polymer (composition: mol %) | N-carboxy-L-amino acid anhydride | | Mw |
|---|---|---|---|
| | component A | component B | |
| Syn. Ex. 20 | γ-methyl-L-glutamic acid (68%)-N$^\epsilon$-benzyloxycarbonyl-L-lysine (32%) block copolymer | γ-methyl-L-glutamic acid | N$^\epsilon$-benzyloxycarbonyl-L-lysine | 1.7 × 10$^4$ |
| Syn. Ex. 21 | γ-methyl-L-glutamic acid (41%)-N$^\epsilon$-benzyloxycarbonyl-L-lysine (18%)-γ-methyl-L-glutamic acid (41%) block copolymer | γ-methyl-L-glutamic acid | N$^\epsilon$-benzyloxycarbonyl-L-lysine | 4.8 × 10$^4$ |
| Syn. Ex. 22 | γ-benzyl-L-glutamic acid (50%)-N$^\epsilon$-benzyloxycarbonyl-L-lysine (50%) block copolymer | γ-benzyl-L-glutamic acid | N$^\epsilon$-benzyloxycarbonyl-L-lysine | 3.5 × 10$^4$ |
| Syn. Ex. 23 | N$^\epsilon$-benzyloxycarbonyl-L-lysine (48%)-γ-benzyl-L-glutamic acid (52%) block copolymer | γ-benzyl-L-glutamic acid | N$^\epsilon$-benzyloxycarbonyl-L-lysine | 1.7 × 10$^4$ |
| Syn. Ex. 24 | γ-benzyl-L-glutamic acid (25%)-N$^\epsilon$-benzyloxycarbonyl-L-lysine (75%) block copolymer | γ-benzyl-L-glutamic acid | N$^\epsilon$-benzyloxycarbonyl-L-lysine | 2.0 × 10$^4$ |
| Syn. Ex. 25 | γ-benzyl-L-glutamic acid (75%)-N$^\epsilon$-benzyloxycarbonyl-L-lysine (25%) block copolymer | γ-benzyl-L-glutamic acid | N$^\epsilon$-benzyloxycarbonyl-L-lysine | 1.5 × 10$^4$ |
| Syn. Ex. 26 | γ-benzyl-L-glutamic acid (53%)-N$^\epsilon$-benzyloxycarbonyl-L-lysine (47%) block copolymer | γ-benzyl-L-glutamic acid | N$^\epsilon$-benzyloxycarbonyl-L-lysine | 1.4 × 10$^6$ |
| Syn. Ex. 27 | γ-methyl-L-glutamic acid (29%)/γ-hexyl-L-glutamic acid (23%)-N$^\epsilon$-benzyloxycarbonyl-L-lysine (48%) block copolymer | γ-benzyl-L-glutamic acid | N$^\epsilon$-benzyloxycarbonyl-L-lysine, γ-hexyl-L-glutamic acid | 1.9 × 10$^4$ |

Comparative Synthetic Example 1

Synthesis of poly-γ-methyl-L-glutamic acid

N-Carboxy-γ-methyl-L-glutamic acid anhydride (1.42 g, 7.60 mmol) was added to 1,2-dichloroethane (10.7 ml), and the mixture was cooled to 0° C. N,N-Dimethyl-1,3-propanediamine (0.96 μl, 7.6 μmol) was added as an initiator, and the mixture was stirred at 25° C. for 1 day.

Comparative Synthetic Example 2

Synthesis of poly-γ-benzyl-L-glutamic acid

N-Carboxy-γ-methyl-L-glutamic acid anhydride (2.00 g, 7.60 mmol) was added to 1,2-dichloroethane (11.1 ml), and the mixture was cooled to 0° C. N,N-Dimethyl-1,3-propanediamine (0.96 μl, 7.6 μmol) was added as an initiator, and the mixture was stirred at 25° C. for 1 day.

TABLE 4

| | polymer | N-carboxy-L-amino acid anhydride | Mw |
|---|---|---|---|
| Comparative Synthetic Example 1 | poly-γ-methyl-L-glutamic acid | γ-methyl-L-glutamic acid | $3.3 \times 10^4$ |
| Comparative Synthetic Example 2 | poly-γ-benzyl-L-glutamic acid | γ-benzyl-L-glutamic acid | $3.8 \times 10^4$ |

Preparation of Element.

Using the poly(α-amino acid) of Synthetic examples 1, 3, 4, 6, 7, 16, 20, 21, 22, and 26 and based on the following element production method, the element shown in FIG. 1 was produced. A poly(α-amino acid) thin film (piezoelectric substance film) was formed by a cast method.

Element Production Method.

Poly(ethylene terephthalate) (PET) substrate, 1, (thickness: 125±5 μm) vapor deposited with an ITO (indium tin oxide) electrode as electrode, 2, was washed with methanol. On the washed substrate (length: 18 mm, width: 12 mm), a polymer thin film was formed as a piezoelectric substance film, 3, from a poly(α-amino acid) solution by a cast method. The thin film was sandwiched with PET substrate, 5, vapor deposited with an ITO electrode, 4, to prepare an element.

Table 5 shows the solvents and solution concentrations of the poly(α-amino acid) solutions of Synthetic examples 1, 3, 4, 6, 7, 16, 20, 21, 22, and 26 used for the formation of piezoelectric substance films and the film thickness after film forming.

TABLE 5

| | solvent | solution concentration % (w/w) | film thickness μm |
|---|---|---|---|
| Syn. Ex. 1 | chloroform | 6.3 | 48 |
| Syn. Ex. 3 | chloroform | 6.3 | 17 |
| Syn. Ex. 4 | chloroform | 17.2 | 68 |
| Syn. Ex. 6 | chloroform | 6.5 | 19 |
| Syn. Ex. 7 | chloroform | 9.5 | 42 |
| Syn. Ex. 16 | chloroform | 6.3 | 50 |
| Syn. Ex. 20 | 1,2-dichloroethane | 12.9 | 35 |
| Syn. Ex. 21 | 1,2-dichloroethane | 17.9 | 26 |
| Syn. Ex. 22 | 1,2-dichloroethane | 12.8 | 59 |
| Syn. Ex. 26 | 1,2-dichloroethane | 12.8 | 19 |

Measurement and Evaluation.

Measurement Method 1: Measurement Method of Weight Average Molecular Weight.

The weight average molecular weight, Mw, was measured by gel penetration chromatography (GPC). To be specific, an analysis column apparatus (manufactured by Showa Denko K.K., Shodex K-802 and K-806M) was set on an analysis apparatus for GPC (manufactured by Hitachi, Ltd., LaChrom Elite), 10 to 80 μl of a measurement solution prepared separately was injected, and the measurement was performed under the conditions of eluent flow rate: 1 ml/min, column retention temperature: 40° C., solvent: chloroform. The measurement solution was prepared by dissolving the polyamino acid in chloroform to a concentration of 0.25 to 3.0% (w/v), filtering the solution through a filter. The weight average molecular weight, Mw, was calculated by comparing the retention time of the obtained peak with that of separately-measured polystyrene for calibration (manufactured by Showa Denko K.K., Shodex STANDARD SM-105).

Measurement Method 2: Composition Measurement Method of Copolymer after Transesterification Reaction.

A sample (several dozen mg) was dissolved in deuterated chloroform or deuterated trifluoroacetic acid, $^1$H nuclear magnetic resonance spectrum ($^1$H NMR, BRUKER, 400 MHz) was analyzed, the peak area of proton at the α-position of amino acid before and after transesterification or on copolymerization was compared to calculate the composition. A measurement example is shown below.

Composition measurement of γ-methyl-L-glutamic acid/γ-hexyl-L-glutamic acid copolymer.

The synthesized copolymer (10 mg) was dissolved in deuterated trifluoroacetic acid, and the $^1$H NMR was measured. As a result, a peak derived from the methyl group of γ-methyl-L-glutamic acid was detected near 3.8 ppm, and a peak derived from the proton at the α-position of γ-methyl-L-glutamic acid and γ-hexyl-L-glutamic acid was detected near 4.7 ppm. When peak area near 3.8 ppm is A and that near 4.7 ppm is B, A/B=1.17. Since A/B=3.00 for poly-γ-methyl-L-glutamic acid, the decreased portion is considered to be substituted by a hexyl group. Therefore, the content percentage of the hexyl group is 61% since 1.83/3.00=0.61. Hence, the composition of the copolymer is γ-methyl-L-glutamic acid (39%)/γ-hexyl-L-glutamic acid (61%).

Composition measurement of γ-benzyl-L-glutamic acid/N$^\epsilon$-benzyloxycarbonyl-L-lysine copolymer.

The synthesized copolymer (10 mg) was dissolved in deuterated trifluoroacetic acid, and the $^1$H NMR was measured. As a result, a peak derived from the benzyl group of N$^\epsilon$-benzyloxycarbonyl-L-lysine and the benzyl group of γ-benzyl-L-glutamic acid was detected near 5.1 ppm, a peak derived from the proton at the α-position of γ-benzyl-L-glutamic acid was detected near 4.7 ppm, and a peak derived from the proton at the α-position of N$^\epsilon$-benzyloxycarbonyl-L-lysine was detected near 4.4 ppm. When the peak areas near 5.1 ppm, 4.7 ppm, 4.4 ppm are A, B, C, respectively, A/B=4.00, A/C=4.00, and B/C=1.00. Since both B and C represent an area of one proton, the composition of the copolymer is γ-benzyl-L-glutamic acid (50%)/N$^\epsilon$-benzyloxycarbonyl-L-lysine (50%).

As shown in the above-mentioned two cases, the composition of a copolymer after the transesterification reaction can be calculated by comparing the peak area of methyl group and α-position when γ-methyl-L-glutamic acid is present, and benzyl group and α-position when γ-benzyl-L-glutamic acid is present.

Measurement Method 3: Evaluation Method of Piezoelectric Constant d33.

Various synthesized polyamino acid solutions were applied to copper foil (manufactured by JX Nippon Mining & Metals Corp., JTC 35 μm), and dried by leaving the same at room temperature for 12 hours or longer. This was cut in 1 cm square, and piezoelectric constant d33 was measured with a d33 meter (manufactured by Nippon FerroTechnology Corporation, NPT22001T). The measurement was performed at upper contact electrode 5 φ, load 150 g.

TABLE 6

| | polymer (composition:mol %) | piezoelectric constant d33 (pC/N) |
|---|---|---|
| Syn. Ex. 5 | γ-methyl-L-glutamic acid (17%)/γ-hexadecyl-L-glutamic acid (83%) copolymer | 48 |
| Syn. Ex. 7 | γ-methyl-L-glutamic acid (40%)/γ-2-norbornylmethyl-L-glutamic acid (60%) copolymer | 15 |
| Syn. Ex. 8 | γ-benzyl-L-glutamic acid (55%)/γ-2-norbornylmethyl-L-glutamic acid (45%) copolymer | 32 |
| Syn. Ex. 20 | γ-methyl-L-glutamic acid (68%)-N$^\varepsilon$-benzyloxycarbonyl-L-lysine (32%) block copolymer | 14 |
| Syn. Ex. 21 | γ-methyl-L-glutamic acid (41%)-N$^\varepsilon$-benzyloxycarbonyl-L-lysine (18%)-γ-methyl-L-glutamic acid (41%) block copolymer | 16 |
| Syn. Ex. 22 | γ-benzyl-L-glutamic acid (50%)-N$^\varepsilon$-benzyloxycarbonyl-L-lysine (50%) block copolymer | 21 |

TABLE 6-continued

| | polymer (composition:mol %) | piezoelectric constant d33 (pC/N) |
|---|---|---|
| Syn. Ex. 23 | N$^\varepsilon$-benzyloxycarbonyl-L-lysine (48%)-γ-benzyl-L-glutamic acid (52%) block copolymer | 23 |
| Syn. Ex. 24 | γ-benzyl-L-glutamic acid (25%)-N$^\varepsilon$-benzyloxycarbonyl-L-lysine (75%) block copolymer | 27 |
| Syn. Ex. 25 | γ-benzyl-L-glutamic acid (75%)-N$^\varepsilon$-benzyloxycarbonyl-L-lysine (25%) block copolymer | 17 |

Evaluation Method 1: Evaluation of Piezoelectric Element.

The electromotive force generated by applying a load (about 6 kg) to the produced element was measured at room temperature (20° C.) by a source meter manufactured by KEITHLEY, and the intensity of the electric field was determined from the film thickness, based on which the piezoelectric element was evaluated. The evaluation criteria are as follows:

⊙: electric field not less than 0.50 V/μm;
○: electric field not less than 0.30 V/μm and less than 0.50 V/μm;
Δ: electric field not less than 0.25 V/μm and less than 0.30 V/μm; and
x: electric field less than 0.25 V/μm.

TABLE 7

| | poly(α-amino acid) | | piezoelectricity | | | film thickness (μm) |
|---|---|---|---|---|---|---|
| | | | maximum electromotive force (V) | electric field (V/μm) | evaluation | |
| Ex. 1 | γ-methyl-L-glutamic acid (48%)/γ-hexyl-L-glutamic acid (52%) copolymer | Syn. ex. 1 | 15.0 | 0.313 | ○ | 48 |
| Ex. 2 | γ-methyl-L-glutamic acid (50%)/γ-dodecyl-L-glutamic acid (50%) copolymer | Syn. ex. 3 | 6.0 | 0.353 | ○ | 17 |
| Ex. 3 | γ-benzyl-L-glutamic acid (60%)/γ-dodecyl-L-glutamic acid (40%) copolymer | Syn. ex. 4 | 20.8 | 0.306 | ○ | 68 |
| Ex. 4 | γ-methyl-L-glutamic acid (40%)/γ-2-norbornylmethyl-L-glutamic acid (60%) copolymer | Syn. ex. 6 | 34.0 | 1.790 | ⊙ | 19 |
| Ex. 5 | γ-benzyl-L-glutamic acid (55%)/γ-2-norbornylmethyl-L-glutamic acid (45%) copolymer | Syn. ex. 7 | 18.0 | 0.430 | ○ | 42 |
| Ex. 6 | γ-benzyl-L-glutamic acid (49%)/N$^\varepsilon$-benzyloxycarbonyl-L-lysine (51%) copolymer | Syn. ex. 16 | 49.0 | 0.980 | ⊙ | 50 |
| Ex. 7 | γ-methyl-L-glutamic acid (68%)-N$^\varepsilon$-benzyloxycarbonyl-L-lysine (32%) block copolymer | Syn. ex. 20 | 17.0 | 0.486 | ○ | 35 |
| Ex. 8 | γ-methyl-L-glutamic acid (41%)-N$^\varepsilon$-benzyloxycarbonyl-L-lysine (18%)-γ-methyl-L-glutamic acid (41%) block copolymer | Syn. ex. 21 | 7.0 | 0.269 | Δ | 26 |
| Ex. 9 | γ-benzyl-L-glutamic acid (50%)-N$^\varepsilon$-benzyloxycarbonyl-L-lysine (50%) block copolymer | Syn. ex. 22 | 30.6 | 0.519 | ⊙ | 59 |
| Ex. 10 | γ-benzyl-L-glutamic acid (53%)-N$^\varepsilon$-benzyloxycarbonyl-L-lysine (47%) block copolymer | Syn. ex. 26 | 33.9 | 1.784 | ⊙ | 19 |
| Comp. Ex. 1 | poly-γ-methyl-L-glutamic acid | | 7.0 | 0.137 | X | 51 |
| Comp. Ex. 2 | poly-γ-benzyl-L-glutamic acid | | 13.0 | 0.245 | X | 53 |

Thus, it was clarified that the specific poly(α-amino acid) of the present invention can form a thin film showing high uniformity in the film thickness. When a thin film of poly(α-amino acid) of Comparative Example 1 or 2, described in JP-A-H11-217432 or JP-A-2005-217111, was used, the piezoelectricity was insufficient. However, a piezoelectric element using a thin film of the specific poly(α-amino acid) of the present invention showed sufficient piezoelectricity. Particularly, γ-methyl-L-glutamic acid/γ-2-norbornylmethyl-L-glutamic acid (Example 4) copolymer and γ-benzyl-L-glutamic acid-N$^ε$-benzyloxycarbonyl-L-lysine block copolymer (high molecular weight copolymer) (Example 10) exhibited preferable results.

Evaluation Method 2: Evaluation of Solubility in Solvent.

A synthesized compound (20 parts by weight) was added to various solvents (80 parts by weight). When a solution was obtained, the compound was mixed at a ratio of 20 w %, and the mixture was stirred at room temperature, based on which the solubility was evaluated.

The evaluation criteria are as follows:
○: completely dissolved;
Δ: partially dissolved; and
x: insoluble.

INDUSTRIAL APPLICABILITY

According to the present invention, a printable piezoelectric substance can be provided, and a flexible piezoelectric element can be provided.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A piezoelectric element, comprising at least one poly (α-amino acid), which contains:

TABLE 8

| solvent | γ-methyl-L-glutamic acid (48%)/γ-hexyl-L-glutamic acid (52%) copolymer Synthetic Example 1 | γ-methyl-L-glutamic acid (18%)/γ-hexyl-L-glutamic acid (82%) copolymer Synthetic Example 2 | γ-benzyl-L-glutamic acid (60%)/γ-dodecyl-L-glutamic acid (40%) copolymer Synthetic Eample 4 | γ-methyl-L-glutamic acid (68%)-N$^ε$-benzyloxycarbonyl-L-lysine (32%) block copolymer Synthetic Example 20 | γ-methyl-L-glutamic acid (41%)-N$^ε$-benzyloxycarbonyl-L-lysine (18%)-γ-methyl-L-glutamic acid (41%) block copolymer Synthetic Example 21 | poly-γ-methyl-L-glutamic acid | poly-γ-benzyl-L-glutamic acid |
|---|---|---|---|---|---|---|---|
| dichloromethane | ○ | ○ | ○ | ○ | ○ | ○ | ○ |
| cyclohexanone | ○ | ○ | ○ | ○ | Δ | X | ○ |
| N,N-dimethylacetamide | ○ | ○ | ○ | ○ | ○ | X | ○ |
| methyl benzoate | ○ | ○ | ○ | ○ | ○ | X | Δ |
| toluene | ○ | ○ | ○ | Δ | Δ | X | X |
| triglyme | ○ | ○ | ○ | ○ | X | X | X |

The solvents used for the experiments were as described below.

dichloromethane: manufactured by JUNSEI CHEMICAL CO., LTD., special grade cyclohexanone: manufactured by Tokyo Chemical Industry Co., Ltd.

N,N-dimethylacetamide: manufactured by Kanto Chemical CO., Inc., Cica special grade methyl benzoate: manufactured by Kanto Chemical CO., Inc., Cica special grade toluene: manufactured by JUNSEI CHEMICAL CO., LTD., special grade triglyme (triethylene glycol dimethyl ether): manufactured by NACALAI TESQUE, INC.

(A) glutamic acid γ-ester units represented by formula (I):

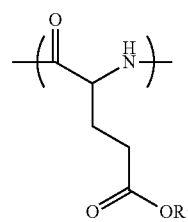

(I)

wherein R$^1$ is a methyl group or a benzyl group; and (B) units of one or more types selected from the group consisting of:

(1) a glutamic acid γ-ester unit represented by formula (II):

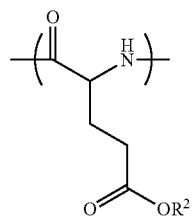

(II)

wherein $R^2$ is an unsubstituted alkyl group having 6 to 18 carbon atoms, or a substituted alkyl group having 1 to 6 carbon atoms, in which the hydrogen atoms are partly or entirely substituted by a halogen atom or an alicyclic hydrocarbon group having 3 to 12 carbon atoms;

(2) an alanine unit, a phenylalanine unit, and an $N^\epsilon$-benzyloxycarbonyllysine unit, which are represented by formula (III):

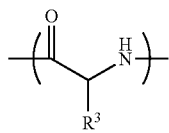

(III)

wherein $R^3$ is a methyl group, a benzyl group or a $(CH_2)_4$—NHZ group, in which Z is a benzyloxycarbonyl group; and (3) a glutamic acid γ-ester unit represented by formula (IV):

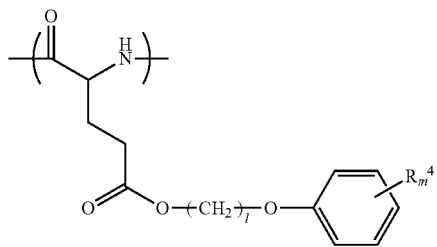

(IV)

wherein each $R^4$ may be the same or different and is an alkoxy group having 1 to 12 carbon atoms; an alkyl group having 1 to 12 carbon atoms, in which the hydrogen atoms are partly or entirely substituted by a halogen atom; or an alkylcarbonyl group, in which the alkyl group has 1 to 12 carbon atoms; l is an integer of 6 to 12; and m is an integer of 1 to 3.

2. The piezoelectric element according to claim 1, wherein $R^2$ is an unsubstituted alkyl group having 6 to 18 carbon atoms, or an alkyl group having 1 to 6 carbon atoms in which the hydrogen atoms are partly or entirely substituted by a fluorine atom or norbornyl group.

3. The piezoelectric element according to claim 1, wherein $R^2$ is an n-hexyl group, an n-dodecyl group, an n-hexadecyl group, a 2-norbornylmethyl group, or a 2,2,2-trifluoroethyl group.

4. The piezoelectric element according to claim 1, wherein $R^3$ is a $(CH_2)_4$—NHZ group, in which Z is a benzyloxycarbonyl group.

5. The piezoelectric element according to claim 1, wherein $R^4$ is an alkoxy group having 1 to 6 carbon atoms; an alkyl group having 1 to 12 carbon atoms, in which the hydrogen atoms are partly or entirely substituted by a fluorine atom; or an alkylcarbonyl group, in which the alkyl group has 3 to 9 carbon atoms.

6. The piezoelectric element according to claim 1, wherein $R^4$ is a methoxy group, a butoxy group, a hexyloxy group, a trifluoromethyl group, or an n-hexylcarbonyl group.

7. The piezoelectric element according to claim 1, wherein the polyamino acid is one or more kinds selected from the group consisting of:

a γ-methyl-L-glutamic acid/γ-hexyl-L-glutamic acid copolymer, a γ-methyl-L-glutamic acid/γ-dodecyl-L-glutamic acid copolymer, a γ-benzyl-L-glutamic acid/γ-dodecyl-L-glutamic acid copolymer, a γ-methyl-L-glutamic acid/γ-hexadecyl-L-glutamic acid copolymer, a γ-methyl-L-glutamic acid/γ-2,2,2-trifluoroethyl-L-glutamic acid copolymer, a γ-methyl-L-glutamic acid/γ-2-norbornylmethyl-L-glutamic acid copolymer, a γ-benzyl-L-glutamic acid/γ-2-norbornylmethyl-L-glutamic acid copolymer, a γ-methyl-L-glutamic acid/γ-(6-(p-methoxyphenoxy)-1-hexyl)-L-glutamic acid copolymer, a γ-methyl-L-glutamic acid/γ-(6-(p-hexylcarbonylphenoxy)-1-hexyl)-L-glutamic acid copolymer, a γ-methyl-L-glutamic acid/γ-(10-(p-methoxyphenoxy)-1-decyl)-L-glutamic acid copolymer, a γ-methyl-L-glutamic acid/γ-(6-(p-butoxyphenoxy)-1-hexyl)-L-glutamic acid copolymer, a γ-methyl-L-glutamic acid/γ-(6-(p-hexyloxyphenoxy)-1-hexyl)-L-glutamic acid copolymer, a γ-methyl-L-glutamic acid/γ-(6-(3,5-bis(trifluoromethyl)phenoxy)-1-hexyl)-L-glutamic acid copolymer, a γ-methyl-L-glutamic acid/$N^\epsilon$-benzyloxycarbonyl-L-lysine copolymer, a γ-benzyl-L-glutamic acid/$N^\epsilon$-benzyloxycarbonyl-L-lysine copolymer, a γ-methyl-L-glutamic acid/L-phenylalanine copolymer, a γ-benzyl-L-glutamic acid/L-phenylalanine copolymer, and a γ-benzyl-L-glutamic acid/L-alanine copolymer.

8. The piezoelectric element according to claim 1, wherein the poly(α-amino acid) is a random copolymer.

9. The piezoelectric element according to claim 1, wherein the poly(α-amino acid) is a block copolymer.

10. The piezoelectric element according to claim 1, wherein the poly(α-amino acid) has a weight average molecular weight (Mw) of 1,000 to 5,000,000.

11. The piezoelectric element according to claim 1, further comprising a flexible substrate and an electrode.

12. The piezoelectric element according to claim 1, wherein the poly(α-amino acid) is in the form of a thin film.

13. The piezoelectric element according to claim 12, wherein the poly(α-amino acid) is in the form of a thin film having a thickness of 500 nm to 500 μm.

14. A method of producing a piezoelectric element according to claim 1, comprising:

(a) forming a lower electrode on a first flexible support;

(b) forming a film of a poly(α-amino acid) on said lower electrode; and (c) forming an upper electrode on said film of a poly(α-amino acid).

15. A polyamino acid-containing ink, comprising:

(1) at least one poly(α-amino acid), which contains:

(A) glutamic acid γ-ester units represented by formula (I):

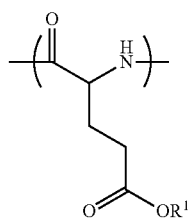

(I)

wherein $R^1$ is a methyl group or a benzyl group; and (B) units of one or more types selected from the group consisting of:

(1) a glutamic acid γ-ester unit represented by formula (II):

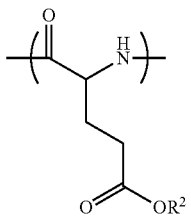

(II)

wherein $R^2$ is an unsubstituted alkyl group having 6 to 18 carbon atoms, or a substituted alkyl group having 1 to 6 carbon atoms, in which the hydrogen atoms are partly or entirely substituted by a halogen atom or an alicyclic hydrocarbon group having 3 to 12 carbon atoms;

(2) an alanine unit, a phenylalanine unit, and an $N^\epsilon$-benzyloxycarbonyllysine unit, which are represented by formula (III):

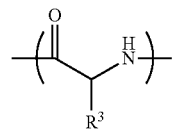

(III)

wherein $R^3$ is a methyl group, a benzyl group or a $(CH_2)_4$—NHZ group, in which Z is a benzyloxycarbonyl group; and (3) a glutamic acid γ-ester unit represented by formula (IV):

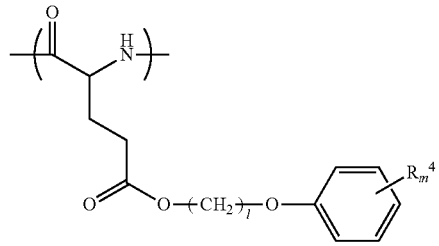

(IV)

wherein each $R^4$ may be the same or different and is an alkoxy group having 1 to 12 carbon atoms; an alkyl group having 1 to 12 carbon atoms, in which the hydrogen atoms are partly or entirely substituted by a halogen atom; or an alkylcarbonyl group, in which the alkyl group has 1 to 12 carbon atoms; l is an integer of 6 to 12; and m is an integer of 1 to 3; and (2) at least one solvent.

* * * * *